(12) United States Patent
Huang

(10) Patent No.: US 8,242,633 B2
(45) Date of Patent: Aug. 14, 2012

(54) POWER-FAILURE PROTECTION CIRCUIT FOR NON-VOLATILE SEMICONDUCTOR STORAGE DEVICES AND METHOD FOR PREVENTING UNEXPECTED POWER-FAILURE USING THE SAME

(75) Inventor: He Huang, Shenzhen (CN)

(73) Assignee: Memoright Memoritech (Wuhan) Co., Ltd., Wuhan (CN)

( * ) Notice: Subject to any disclaimer, the term of this patent is extended or adjusted under 35 U.S.C. 154(b) by 269 days.

(21) Appl. No.: 12/690,176

(22) Filed: Jan. 20, 2010

(65) Prior Publication Data

US 2010/0226194 A1 Sep. 9, 2010

Related U.S. Application Data

(63) Continuation of application No. PCT/IL2008/000989, filed on Jul. 17, 2008.

(30) Foreign Application Priority Data

Jul. 20, 2007 (CN) ...................... 2007 2 0121572 U

(51) Int. Cl.
*H02J 9/00* (2006.01)
*H02M 3/06* (2006.01)

(52) U.S. Cl. ........................... 307/66; 307/109; 320/166

(58) Field of Classification Search .................... 307/66, 307/109; 320/166
See application file for complete search history.

(56) References Cited

U.S. PATENT DOCUMENTS

| | | | | |
|---|---|---|---|---|
| 5,565,761 A | * | 10/1996 | Hwang | 323/222 |
| 6,249,156 B1 | * | 6/2001 | Attwood | 327/110 |
| 6,741,896 B1 | * | 5/2004 | Olzak et al. | 700/82 |
| 7,157,888 B2 | * | 1/2007 | Chen et al. | 323/224 |
| 7,268,525 B2 | * | 9/2007 | Ishii et al. | 323/282 |
| 7,622,898 B2 | * | 11/2009 | Shimizu et al. | 320/166 |
| 7,701,179 B2 | * | 4/2010 | Chen et al. | 323/259 |
| 2004/0001359 A1 | * | 1/2004 | Ott | 365/185.18 |

* cited by examiner

*Primary Examiner* — Hal Kaplan
(74) *Attorney, Agent, or Firm* — Matthias Scholl P.C.; Matthias Scholl

(57) ABSTRACT

A power failure protection circuit (10) for a non-volatile semiconductor storage device includes at least an energy storage unit (C1) that serves as a backup power supply for providing backup electrical energy when a power failure occurs. During normal operation of the device, a main control unit (12) is responsible for controlling an external power input to charge the energy storage unit, for dynamically detecting the status of the energy storage unit and for using information about the status to ensure sufficient backup electrical energy for the energy storage unit. During an abnormal operation of the power supply, the main control unit (12) is responsible for discharging the energy storage unit.

17 Claims, 4 Drawing Sheets

POWER-FAILURE PROTECTION CIRCUIT FOR NON-VOLATILE SEMICONDUCTOR STORAGE DEVICES AND METHOD FOR PREVENTING UNEXPECTED POWER-FAILURE USING THE SAME

CROSS-REFERENCE TO RELATED APPLICATIONS

This application is a continuation of International Patent Application No. PCT/IL2008/000989, with an international filing date of Jul. 17, 2008, designating the United States, now pending, which is based on China Patent Application No. 200720121572.0, filed Jul. 20, 2007. The contents of these specifications, including any intervening amendments thereto, are incorporated herein by reference.

BACKGROUND OF THE INVENTION

1. Field of the Invention

The invention relates to a protection method and circuit for preventing unexpected power failure, and more particularly to protection method and circuit for a non-volatile semiconductor storage device for preventing an unexpected power failure.

2. Description of the Related Art

It is well-known that with the rapid development of semiconductor processes and technology, non-volatile semiconductor storage devices, especially flash memory devices (for example, U-disks, various flash memory cards, MP3 and MP4 players, as well as newly-developed solid state devices), have become popular among consumers. Meanwhile, as the firmware and structures of those devices become increasingly complicated, the read/write of data is usually accomplished by means of files instead of direct operations on the address of a storage unit. When the data is operated by means of file read/write, during the operation of the device, the data is usually buffered in a volatile storage device, such as SDRAM. Thus, once an unexpected power failure occurs, the data will be permanently lost. If the lost data includes the firmware of the device or system information such as the map table of the data address, the device will be fatally damaged. A power failure protection design for flash memory devices can ensure the certainty of the operating status of the device and the completeness of the recorded data when an unexpected power failure of the flash memory device occurs. Thus, the in-situ data and device status information may be recovered in a timely fashion after the power supply of the device is restored, thereby preventing the loss of data and/or confusion of the main control unit (MCU). In saying this, flash memory devices operate at lower power consumption and occupy little space, so complicated power failure protection circuits are not suitable for flash memory devices. Therefore, a power failure protection circuit with a simple configuration and low cost is needed to solve the problems caused by unexpected power failures of flash memory devices.

Many of these issues have been addressed in the prior art. Thus, for example, U.S. Pat. No. 6,856,556 (Hajeck) entitled "Storage subsystem with embedded circuit for protecting against anomalies in power signal from host" discloses a storage subsystem, such as a flash memory card, which includes a charge pump that receives a power signal from a host system, and generates a regulated power signal that is provided to the storage subsystem's controller. When the power signal from the host is interrupted, the charge pump additionally acts as a backup power supply such that the storage subsystem can continue to operate temporarily. The storage subsystem also includes a voltage detection circuit that monitors the power signal from the host system to detect anomalies therein. The voltage detection circuit responds to detection of an anomaly by asserting a busy signal to block the host system from performing write operations to the storage subsystem. By asserting the busy signal, the voltage detection circuit substantially ensures that the backup, regulated power provided by the charge pump will be sufficient for the controller to complete all outstanding operations.

U.S. Pat. No. 7,269,755 (Moshayedi et al.) entitled "Solid-state memory device with protection against power failure" discloses a data preservation system for flash memory systems with a host system. The flash memory system receives a host system power supply and energizes an auxiliary energy store therewith and communicates with the host system via an interface bus, upon loss of the host system power supply, the flash memory system actively isolates the connection to the host system power supply and isolates the interface bus and employs the supplemental energy store to continue write operations to flash memory.

The above patents are typical of backup power supplies that store energy from a host system in a backup reservoir and take the stored energy from the backup reservoir in the event of a malfunction in the host's power supply. Typically the backup reservoir is connected directly to the voltage output of the host's power supply since this avoids the need for an invasive connection to the internal circuitry of the host. But it means that the backup reservoir, typically a storage capacitor, will be fully charged to the output voltage of the host power supply. Any fluctuation in the voltage of the host power supply will also affect the voltage of the backup reservoir. As a result, a gradual drop in the voltage of the host power supply that is not sufficiently large to isolate the host power supply and initiate immediate actuation of the backup supply, may mean that there is insufficient voltage in the backup supply if the voltage of the host power supply subsequently drops to a level that initiates actuation of the backup supply.

Yet a further potential drawback of known systems is the need to provide a control signal to the host power supply. For example, in U.S. Pat. No. 6,856,556, the backup power supply has a controller that feeds a ready/busy signal to the host system. The need to provide such a connection is invasive and precludes a completely standalone solution that can be wholly integrated with the memory device and sold as an independent protected unit for direct connection to a host system.

It would therefore be desirable to provide a backup supply that overcomes these drawbacks.

BRIEF SUMMARY OF THE INVENTION

In view of the above-described problems, it is one objective of the invention to provide a power failure protection method and circuit advantageous in stable performance and easy-to-operate and adapted to a non-volatile semiconductor storage device. A large-capacity capacitor is used as an energy storage and power supply component to supply power to the device for a certain period of time in a situation that the power supply of the device is abnormal, so as to enable the device to save processing data and relevant device status information securely.

To achieve the above objective, in accordance with one embodiment of the invention, provided is a method for protecting a non-volatile semiconductor storage device during a power failure of a power supply, the method comprising: during normal operation of the device, dynamically detecting a status of the energy storage unit and controlling an external power input to charge an energy storage unit according to the status to ensure sufficient backup electrical energy for the energy storage unit; and upon detecting an abnormality of the power supply, discharging the energy storage unit for providing power to the semiconductor storage device.

In certain classes of this embodiment, the status of the energy storage unit is indicative of electrical energy stored in the energy storage unit and controlling an external power input to charge an energy storage unit according to the status to ensure sufficient backup electrical energy for the energy storage unit includes charging the energy storage unit when the electrical energy of the energy storage unit is insufficient and controlling the external power input to stop charging the energy storage unit after the energy storage unit is fully charged.

In certain classes of this embodiment, further comprising dynamically detecting whether or not the power supply is abnormal.

In certain classes of this embodiment, further comprising selecting the external power input to supply power during normal operation of the device, and selecting the energy storage unit to supply power during an abnormal operation.

In certain classes of this embodiment, further comprising adjusting a charge/discharge rate of the energy storage unit so as to ensure that the energy storage unit charges at a rate that is no less than the rate of discharge.

In certain classes of this embodiment, adjusting a charge rate of the energy storage unit includes intermittently storing energy in an inductor and discharging the energy to the energy storage unit; and adjusting a discharge rate of the energy storage unit includes intermittently storing energy in an inductor and discharging the energy to the storage device.

In certain classes of this embodiment, the energy storage unit is a capacitor.

In certain classes of this embodiment, the non-volatile semiconductor storage device is a flash memory.

In certain classes of this embodiment, the invention provides a power failure protection circuit for a non-volatile semiconductor storage device, the power failure protection circuit comprising: an energy storage unit serving as a backup power supply for the storage device for providing backup electrical energy for the storage device when a power failure occurs; and a main control unit responsive to normal operation of the device for dynamically detecting a status of the energy storage unit and controlling an external power input to charge the energy storage unit according to the status to ensure sufficient backup electrical energy for the energy storage unit; and being responsive to an abnormality of the power supply for discharging the energy storage unit for providing power to the semiconductor storage device.

In certain classes of this embodiment, further comprising: a power supply select circuit for selecting the external power supply to provide power to the storage device when the external power supply works normally, and selecting the energy storage unit to supply power to the storage device when the operation of the external power supply is abnormal.

In certain classes of this embodiment, further comprising a charge/discharge control circuit for controlling the charge/discharge of the energy storage unit.

In certain classes of this embodiment, the main control unit adjusts a charge/discharge rate of the energy storage unit through the charge/discharge control circuit to achieve a match between a charge/discharge voltage of the energy storage unit and a supply voltage of the storage device.

In certain classes of this embodiment, the energy storage unit includes a capacitor.

In certain classes of this embodiment, further comprising a buck charge control circuit for feeding power from the external power input to the capacitor, the buck discharge control circuit comprising a charge enable switch, an inductor connected in series between the capacitor and the charge enable switch, and a freewheeling diode connected in anti-parallel to the inductor and the capacitor.

In certain classes of this embodiment, including a buck converter for feeding power from the external power input to the capacitor, the buck converter comprising a charge enable switch, an inductor connected in series between the capacitor and the charge enable switch, and a freewheeling diode connected in anti-parallel to the inductor and the capacitor.

In certain classes of this embodiment, the invention provides A power failure protection circuit for a non-volatile semiconductor storage device, the power failure protection circuit comprising: an energy storage unit serving as a backup power supply for the storage device for providing backup electrical energy for the storage device when a power failure occurs; and a main control unit responsive to normal operation of the device for controlling an external power input to charge the energy storage unit; and being responsive to an abnormality of the power supply for discharging the energy storage unit for providing power to the storage device; the power failure protection circuit further comprises: a buck charge control circuit for feeding power from the external power input to the capacitor, the buck discharge control circuit comprising a charge enable switch, an inductor connected in series between the capacitor and the charge enable switch, and a freewheeling diode connected in anti-parallel to the inductor and the capacitor; and a boost discharge control circuit for supplying the power of the energy storage capacitor to the storage device, the boost discharge control circuit comprising a diode, an inductor and an energy storage capacitor, a discharge enable switch connected across the inductor and the energy storage capacitor, and a decoupling capacitor connected between an output of the power failure protection circuit and GND; whereby the main control unit intermittently open and close the charge enable switch and the discharge enable switch to achieve a match between a charge/discharge voltage of the energy storage unit and a supply voltage of the storage device.

In certain classes of this embodiment, the main control circuit comprises a pulse width modulator module that generates pulses corresponding to the charge enable signal and the discharge enable signal.

In certain classes of this embodiment, the invention provides A method for protecting a non-volatile semiconductor storage device during a power failure of a power supply, the method comprising: during normal operation of the device, controlling an external power input to charge an energy storage unit; and upon detecting an abnormality of the power supply, discharging the energy storage unit for providing power to the semiconductor storage device; controlling an external power input to charge an energy storage unit comprises adjusting a charge rate of the energy storage unit; and discharging the energy storage unit for providing power to the storage device comprises adjusting a discharge rate of the energy storage unit ensure that the energy storage unit charges at a rate that is no less than the rate of discharge.

In certain classes of this embodiment, adjusting the charge rate of the energy storage unit includes intermittently storing energy in an inductor and discharging the energy to the energy storage unit; and adjusting the discharge rate of the energy storage unit includes intermittently storing energy in an inductor and discharging the energy to the storage device.

Thus, in summary, the invention employs a large-capacity capacitor as an energy storage and power supply component, for effectively solving the problems caused by an abnormal power supply of the non-volatile semiconductor storage device, thereby enabling the device to save processing data and device status information when the power supply is abnormal. The charge status of the energy storage unit is dynamically detected, and the charge to the energy storage unit is stopped after the energy storage unit is fully charged, thereby extending the service life of the energy storage unit. In addition, a charge/discharge voltage adjusting circuit is further used to achieve a better match of the voltage between an external power input and an energy storage capacitor and the voltage between the energy storage capacitor and the device power supply output.

DETAILED DESCRIPTION OF THE INVENTION

The applications of a flash memory device serving as a non-volatile semiconductor storage device are illustrated in detail below with reference to the accompanying drawings, where identical components that appear in more than one Figure or that share similar functionality will be referenced by identical reference symbols.

Figure 1:
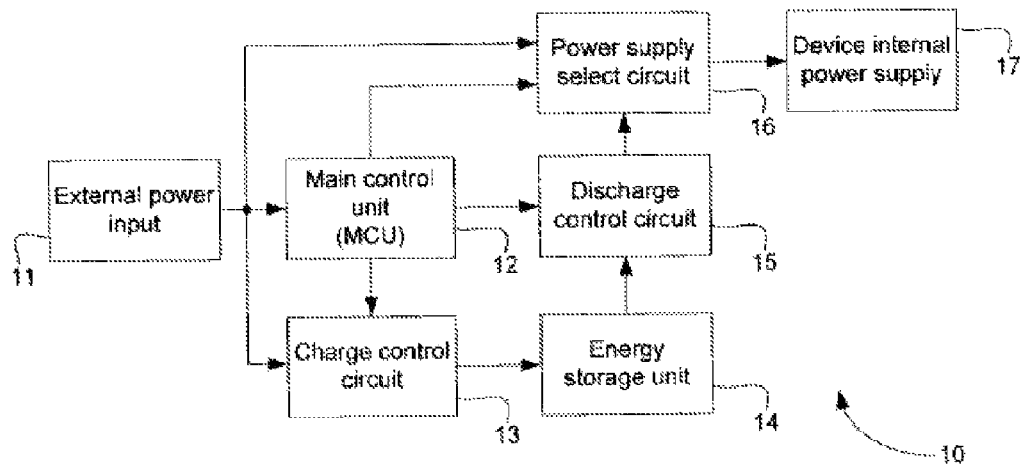
FIG. 1 is a block diagram showing the functionality of a power failure protection circuit in accordance with one embodiment of the invention.

Referring to the circuit principles of FIG. 1, the power failure protection circuit 10 provided by the present invention includes an external power input 11, an MCU 12, a charge control circuit 13, an energy storage unit 14, a discharge control circuit 15, a power supply select circuit 16, and a device power supply output 17. In this embodiment, a large-capacity capacitor is used as the energy storage unit. When the flash memory device works normally, the MCU 12 controls the external power input 11 to charge the energy storage unit 14 through the charge control circuit 13, and controls the external power input 11 to stop charging the energy storage unit 14 after it is fully charged. At the same time, the MCU 12 dynamically detects the voltage of the energy storage unit 14, so as to ensure sufficient backup electrical energy for the energy storage unit regardless of the voltage of the host power supply, and initiates charging the energy storage unit when the electrical energy of the energy storage unit drops below a certain threshold so as to ensure that there is always sufficient charge in the energy storage unit to complete the data transfer to the non-volatile semiconductor storage device in the event of a power failure in the host. The MCU further dynamically detects whether the power supply of the storage unit is abnormal or not. In this context, the voltage of the energy storage unit is considered "abnormal" when it is too low for the semiconductor storage device to operate. When the power supply of the storage device is abnormal, or an unexpected power failure of the storage device occurs whereby the supply voltage of the storage device is too low to sustain a normal operation of the memory device, the MCU controls the power supply select circuit 16, which isolates the host power supply and connects the energy storage unit 14 via the discharge control circuit 15. The discharge control circuit 15 feeds current from the energy storage unit 14 to the power supply 17 such that the output of the energy storage unit provides a protection power supply for the semiconductor storage device through the discharge control circuit and the device power supply output.

The charge/discharge control circuit controls the charge/discharge of the energy storage unit 14. It will be understood that while these are shown in FIG. 1 as two separate functional units, they can also be realized by a shared module. When the charge/discharge voltage of the energy storage unit does not match the supply voltage of the storage device, the charge/discharge control circuit 15 is further used to achieve the match between the charge/discharge voltage of the energy storage unit and the supply voltage of the storage device. Thus, when active, the charge control circuit 13 ensures that the charging current to the energy storage unit 14 is the same as the discharge current thus maintaining constant voltage across the energy storage unit 14. Additionally, the discharge control circuit 15 matches the voltage of the host power supply when discharging to provide suitable voltage to the controller and DRAM, flash array. The embodiment that a charge voltage of the energy storage unit is lower than the supply voltage of the storage device is illustrated hereinafter.

Figure 2:
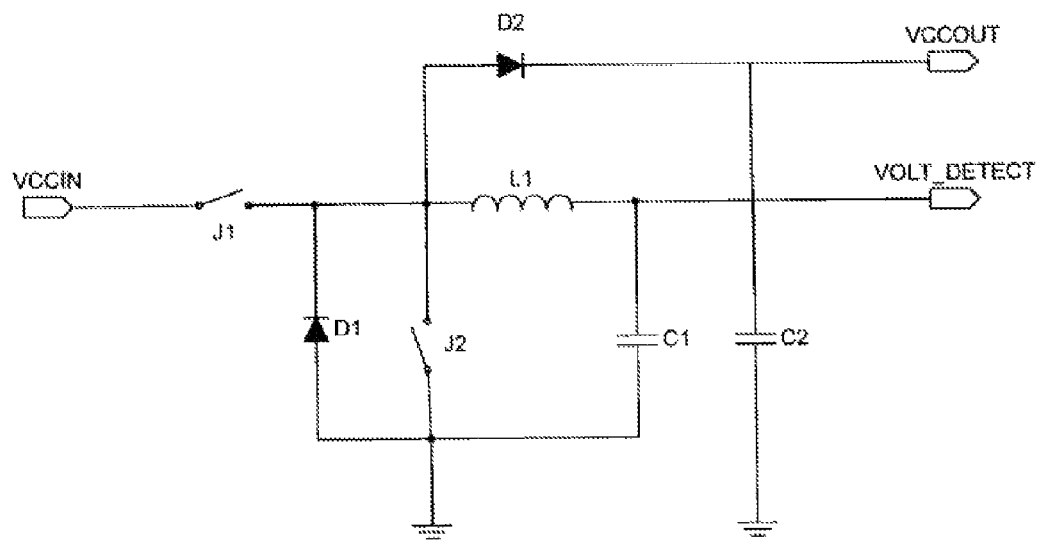
FIG. 2 is a schematic diagram illustrating principles of a power failure protection circuit in accordance with another embodiment of the invention.

FIG. 2 is a schematic circuit diagram illustrating the principles of a power failure protection circuit according to an embodiment of the present invention. In this embodiment, the charge control circuit 13 is based on a buck converter, and the discharge control circuit is based on a boost converter. In FIG. 2, VCCIN is the input power supply that is fed via a charge enable switch J1 to the charge control circuit 13 comprising a first diode D1, whose anode is connected to GND and whose cathode is connected via an inductor L1 to one end of a first capacitor C1, whose other end is connected to GND. The capacitor C1 serves as the energy storage unit 14 whose voltage is constantly monitored via a VOLT_DETECT pin of the MCU 12 for feeding back the charge status of the energy storage unit 14 constituted by the capacitor C1 to the MCU, so as to determine whether or not to disable the charge.

Upon detecting an unexpected power failure of the device occurs, the MCU 12 enables the device power supply through the power supply select circuit 16. This is done by disabling the charge control circuit 13 by opening the charge enable switch J1 and repetitively opening and closing a discharge enable switch J2. When the discharge enable switch J2 is closed, the energy storage capacitor C1 discharges and the inductor L1 stores electrical energy. When the discharge enable switch J2 is open, the energy storage capacitor C1 and the inductor L1 discharge via the switch J2 through a second rectifier diode D2 to the output VCCOUT of the power supply select circuit 16. The voltage of VCCOUT is the sum of the voltages across L1 and C1. A second capacitor C2 is connected between the output VCCOUT of the power supply select circuit 16 and GND and serves to decouple the output of the boost discharge control circuit.

When the host system is powered up, the MCU 12 closes the charge enable switch J1 so that C1 becomes fully charged via the inductor L1. During the charging cycle, the charge enable switch J1 is closed and opened repetitively until C1 is fully charged. In the steady state when C1 is fully charged, the MCU 12 opens the switch J1 so that prior to a power failure C1 remains fully charged. The charging voltage of C1 will be lower than the host power supply voltage. For example, in an embodiment of the invention reduced to practice, the charging voltage of C1 was 2.7V, while the host power supply voltage was 5V. If the MCU 12 detect a drop in voltage across C1 (due to leakage, for example), it will again intermittently close and open J1 so that the charging process is refreshed.

In steady state, when the charge enable switch J1 is open, the capacitor C1 serves to decouple the host power supply voltage VCCIN so that no current flows through the inductor L1 and the voltage across the capacitor C1 is less than VCCIN. When the charge enable switch J1 is now closed, the host power supply charges the capacitor C1, and when the switch J1 is opened, the host power supply stops charging the capacitor C1. By repetitively closing and opening the enable switch J1, there is a constant change of voltage across the capacitor C1, thus ensuring that during the charging process the capacitor C1 is fully charged. The inductor L1 stores energy during the charge/discharge process. The diode D1 serves to maintain a continuous current. During the charge process, the MCU 12 opens the discharge enable switch J2 and intermittently closes and opens the charge enable switch J1, and during the discharge process, the MCU intermittently closes and opens the discharge enable switch J2. The rectifier diode D2 prevents a reverse current flow after the current is boosted.

The charge process operates as follows. When, prior to charging the capacitor C1, the charge enable switch J1 is closed and the discharge enable switch J2 is opened, the diode D1 is not conducting, and J1, L1, feed current which charges C1 through the buck converter. When the charge enable switch J1 is opened, the inductor L1 releases electrical energy to generate a clockwise current, which flows through the capacitor C1 and the diode D1, for storing energy in the capacitor C1. Afterwards, the voltage of the capacitor rises to reach the level of the host power supply through the repeated ON/OFF of the capacitor C1. For so long as the VOLT_DETECT feeds back that the voltage of the capacitor C1 has not reached the threshold, the power supply continues charging the energy storage capacitor C1. When the VOLT_DETECT pin feeds back that the voltage of the capacitor C1 has reached the threshold, the MCU opens J1 to stop charging the energy storage capacitor C1. At this point, the voltage at the non-grounded terminal of C1 is higher than GND, so that the diode D1 is reverse biased, thus preventing current from flowing through D1 when J1 is opened.

The discharge process is as follows. When the charge enable switch J1 is opened and the discharge enable switch J2 is closed, L1, D2, and C1 supply power externally through the boost converter. At the same time, part of the energy across the capacitor C1 is also fed to the inductor L1 via the diode D1, which is reverse-biased during the discharge process, when the discharge enable switch J2 is closed. When both the charge enable switch J1 and the discharge enable switch J2 are opened, the capacitor C1 can only discharge via the reverse-biased diode D1 through the inductor L1, such that the voltage of VCCOUT is the sum of the respective voltages the across capacitor C1 and the inductor L1 both of which store energy during the charging process. As the discharge enable switch J2 is intermittently closed and then opened, the current flowing through the inductor L1 changes. This induces an increased voltage across the inductor L1, whose magnitude depends on the rate of change of the inductor current. Consequently, when the discharge enable switch J2 is closed, the net voltage fed to the output VCCOUT of the power supply select circuit 16 is the sum of the voltages across the inductor L1 and the capacitor C1. The discharge enable switch J2 is repeatedly closed and opened until the MCU 12 finishes saving the desired content or the capacitor C1 is fully discharged. When the host power supply fails, the MCU 12 saves any pending data in a buffer memory whose contents are transferred to the flash chip. All this can easily be accomplished in 1 second and suitable design of the circuit shown in FIG. 2 and switching rate of the charge disable switch J2 ensures that sufficient charge is maintained across the capacitor C1 to achieve this.

Figure 3:
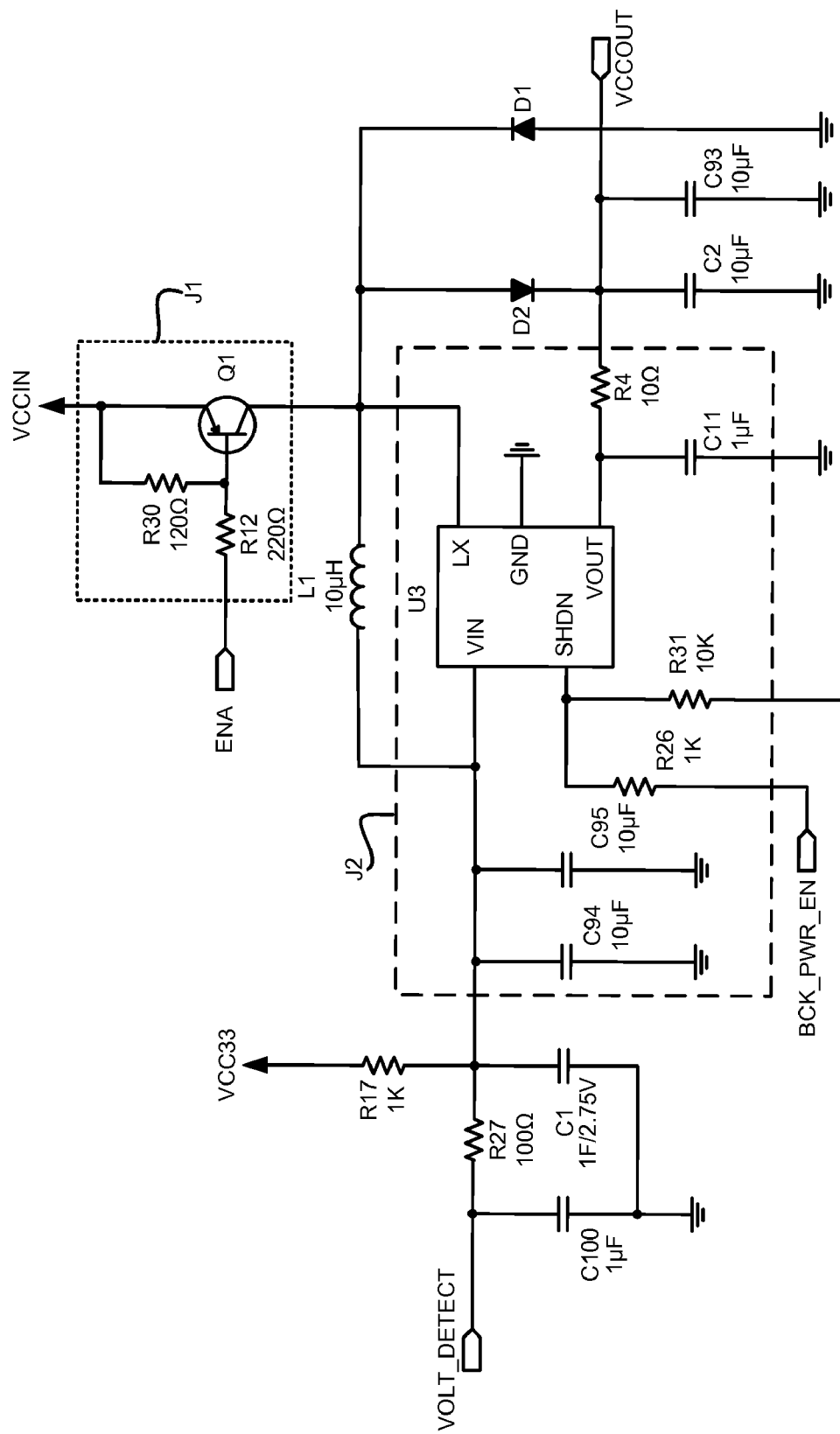
FIG. 3 is a circuit diagram of a power failure protection circuit in accordance with another embodiment of the invention.

FIG. 3 shows a circuit implementation based on the approach of FIG. 2 and which ensures that the above design desiderata are achieved. The charge power supply VCCIN is shown in the upper part of the Figure, and the discharge power supply VCCOUT is shown in the lower right part of the Figure. Capacitors C94, C95, C11, C2, C93, resistors R26, R31, R4, and a DC/DC Boost Regulator U3 such as the SP6641A/B manufactured by Sipex Corporation of California, USA form the discharge enable switch J2. It will be understood that the discharge enable switch J2 serves as the power supply select circuit 16 shown in FIG. 1, since when it is open the host power supply provides power to the non-volatile storage device, while when it is closed, backup power is provided by the energy storage unit. ENA is the voltage supply enable pin, which is activated by the MCU 12 to turn on/off the charge circuit. BCK_PWR_EN is the discharge enable pin, which is activated by the MCU 12 when the power failure of the device occurs so as to enable the energy storage capacitor C1 to supply power. Resistors R12, R30 and a triode Q1 operate as the charge enable switch J1 shown in FIG. 3. Q1 is turned off to stop charging the capacitor C1 when the voltage on ENA is at a high level, and Q1 is turned on to start charging the capacitor C1 when the voltage on ENA is at a low level. A resistor R27 and a capacitor C100 form a filter circuit, mainly used for filtering and providing the over-current protection during the voltage detection process.

Figure 4:
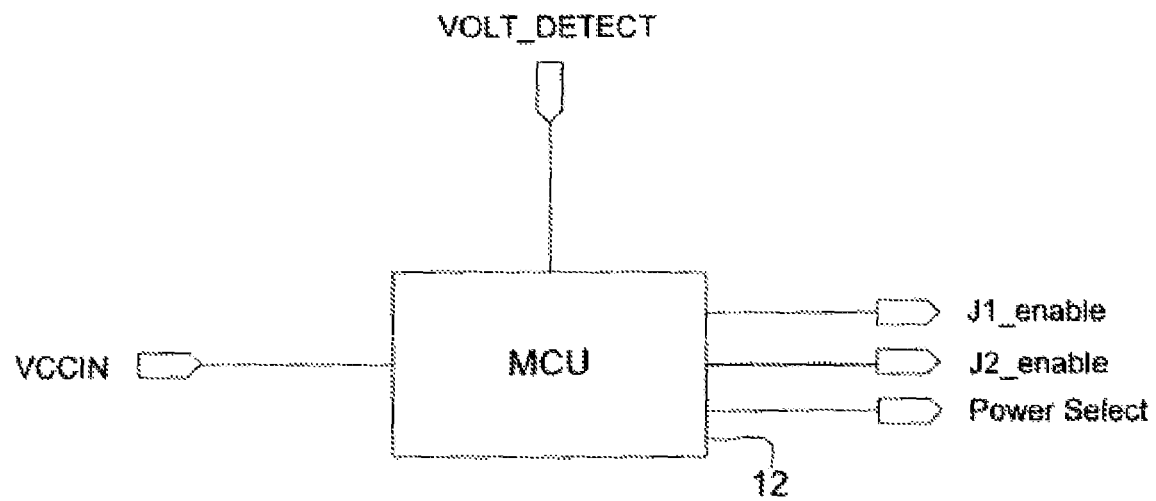
FIG. 4 is a block diagrams showing connectivity to the circuit shown in FIG. 3 of the main control unit in accordance with another embodiment of the invention.
Figure 5:
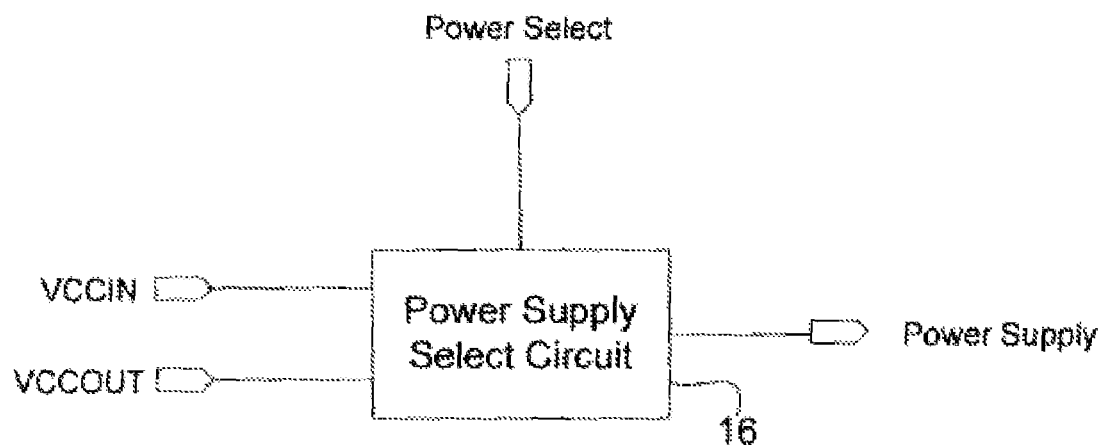
FIG. 5 is a block diagrams showing connectivity to the power supply select circuit shown in FIG. 1.

FIG. 4 and FIG. 5 are block diagrams showing respectively connectivity to the circuit shown in FIG. 3 of the MCU 12 and the power supply select circuit 16 shown in FIG. 1. Thus, the charge power supply VCCIN and the VOLT_DETECT pin are fed to respective inputs of the MCU 12, which feeds respective charge and discharge signals to the charge enable switch J1 and the discharge enable switch J2. The MCU 12 also feeds a power select signal to the power supply select circuit 16. Likewise, the host power supply VCCIN and the backup voltage VCCOUT of the energy storage unit 14 are fed to respective inputs of the power supply select circuit 16 as well as the power select signal from the MCU 12. An output of the power supply select circuit 16 is fed to the power supply 17 shown in FIG. 1. The MCU 12 includes a pulse width modulator (PWM) module that is controlled by a processor and generates pulses corresponding to the charge enable signal J1 and the discharge enable signal J2. The frequencies of the pulse enable signals are determined by the circuit design. The power supply select circuit 16 is responsive to the power select signal produced by the MCU 12 for selectably switching VCCIN or VCCOUT to the power supply 17.

Figure 6:
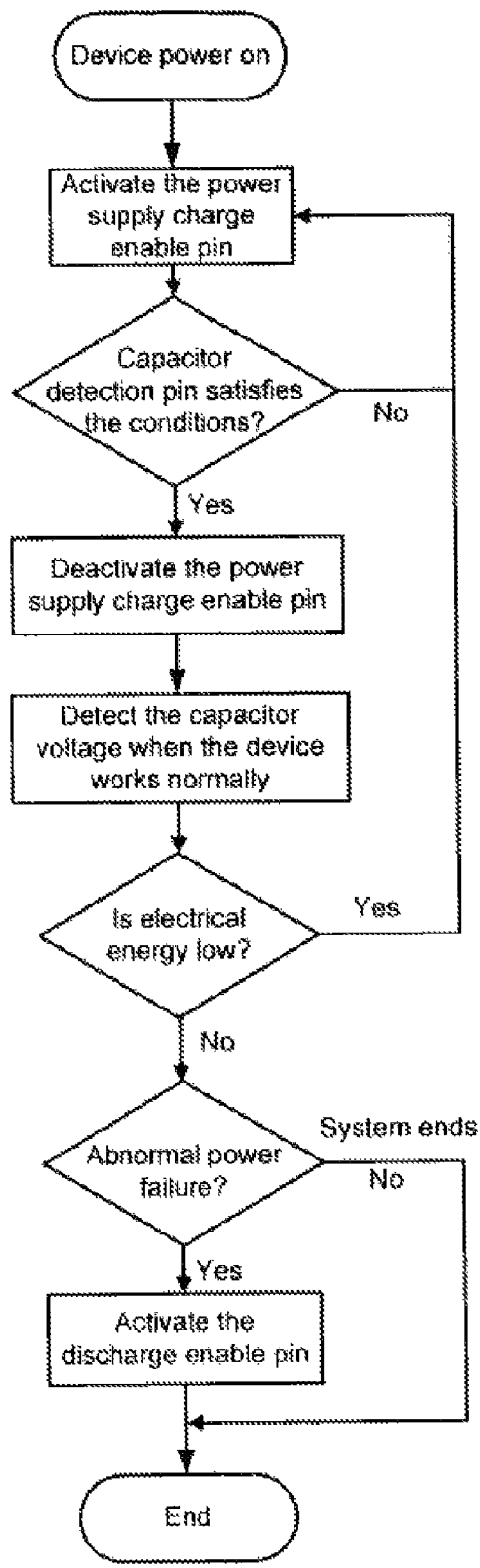
FIG. 6 is a schematic diagram illustrating processes of a power failure protection method in accordance with another embodiment of the invention.

FIG. 6 shows the operating processes of the circuit in the above embodiment. When the device is powered on normally, the MCU 12 intermittently activates the power supply charge enable pin in a pulse mode at a predetermined frequency, so as to charge the energy storage capacitor C1. Then, the MCU periodically queries the capacitor detection pin. If the voltage value does not meet the threshold, the energy storage capacitor C1 is continuously charged, and if the voltage value meets the threshold, the power supply charge enable pin is deactivated to stop charging the capacitor. Thereafter, the MCU controls the discharge enable pin according to the status of the external power supply. If the power supply of the device becomes abnormal, the MCU intermittently activates the discharge enable pin in a pulse mode at a frequency determined by the inductor L1, so as to discharge the energy storage capacitor C1. Meanwhile, the boost circuit provides a supply voltage to the storage device for a certain period of time, such that the MCU has enough time to save processing data and relevant device status information so as to ensure the recovery of the in situ data and device status when the power supply is normally provided again. If the operation ends normally without the unexpected power failure, the MCU enters a system ended state, and the processing data and device status information are saved normally. In such case, the protection circuit does not need to supply power.

It will be appreciated that though the present invention has been described with reference to the above embodiments, they are not intended to limit the present invention, and other methods and circuits can be used to implement the present invention.

It will also be understood that the power failure protection apparatus provided by the present invention is not only applicable to a semiconductor storage device, but also to other electronic products affected by unexpected power failure, so as to prevent damages caused by unexpected power failure.

While particular embodiments of the invention have been shown and described, it will be obvious to those skilled in the art that changes and modifications may be made without departing from the invention in its broader aspects, and therefore, the aim in the appended claims is to cover all such changes and modifications as fall within the true spirit and scope of the invention.

The invention claimed is:

1. A method for protecting a non-volatile semiconductor storage device during a power failure of a power supply, said method comprising:
    during normal operation of the device, dynamically detecting a status of an energy storage unit and controlling an external power input to charge an energy storage unit according to the status to ensure sufficient backup electrical energy for the energy storage unit;
    upon detecting an abnormality of the power supply, discharging the energy storage unit for providing power to the semiconductor storage device; and
    adjusting a charge/discharge rate of the energy storage unit so as to ensure that the energy storage unit charges at a rate that is no less than the rate of discharge; and
    wherein adjusting a charge rate of the energy storage unit includes intermittently storing energy in an inductor and discharging said energy to the energy storage unit; and adjusting a discharge rate of the energy storage unit includes intermittently storing energy in an inductor and discharging said energy to the storage device.

2. The method of claim 1, wherein the status of the energy storage unit is indicative of electrical energy stored in the energy storage unit and controlling an external power input to charge an energy storage unit according to the status to ensure sufficient backup electrical energy for the energy storage unit includes charging the energy storage unit when the electrical energy of the energy storage unit is insufficient and controlling the external power input to stop charging the energy storage unit after the energy storage unit is fully charged.

3. The method of claim 1, further comprising dynamically detecting whether or not the power supply is abnormal.

4. The method of claim 2, further comprising dynamically detecting whether or not the power supply is abnormal.

5. The method of claim 3, further comprising selecting the external power input to supply power during normal operation of the device, and selecting the energy storage unit to supply power during an abnormal operation.

6. The method of claim 1, wherein the energy storage unit is a capacitor.

7. The method of claim 1, wherein the non-volatile semiconductor storage device is a flash memory.

8. A power failure protection circuit (10) for a non-volatile semiconductor storage device, said power failure protection circuit comprising:
    an energy storage unit (C1) serving as a backup power supply for the storage device for providing backup electrical energy for the storage device when a power failure occurs; and
    a main control unit (12) responsive to normal operation of the device for controlling an external power input to charge the energy storage unit; and being responsive to an abnormality of the power supply for discharging the energy storage unit for providing power to the storage device;
wherein said power failure protection circuit further comprises:
    a buck charge control circuit for feeding power from the external power input to said energy storage unit (C1), said buck charge control circuit comprising a charge enable switch (J1, R12, R30, Q1), an inductor (L1) connected in series between said energy storage unit (C1) and the charge enable switch (J1), and a freewheeling diode (D1) connected in anti-parallel to the inductor and the energy storage unit (C1); and
    a boost discharge control circuit for supplying the power of the energy storage unit (C1) to the storage device, said boost discharge control circuit comprising a diode (D2), an-inductor (L1) and an energy storage capacitor unit (C1), a discharge enable switch (J2) connected across the inductor and the energy storage unit (C1), and a decoupling capacitor (C2) connected between an output of the power failure protection circuit and GND;
    whereby the main control unit intermittently opens and closes the charge enable switch (J1) and the discharge enable switch (J2) to achieve a match between a charge/discharge voltage of the energy storage unit and a supply voltage of the storage device.

9. The power failure protection circuit according to claim 8, wherein the main control circuit comprises a pulse width modulator module that generates pulses corresponding to the charge enable signal and the discharge enable signal.

10. A method for protecting a non-volatile semiconductor storage device during a power failure of a power supply, said method comprising:
    during normal operation of the device, controlling an external power input to charge an energy storage unit; and
    upon detecting an abnormality of the power supply, discharging the energy storage unit for providing power to the semiconductor storage device;
    wherein controlling an external power input to charge an energy storage unit comprises adjusting a charge rate of the energy storage unit; and discharging the energy storage unit for providing power to the storage device comprises adjusting a discharge rate of the energy storage unit to ensure that the energy storage unit charges at a rate that is no less than the rate of discharge.

11. A method for protecting a non-volatile semiconductor storage device during a power failure of a power supply, the method comprising:

during normal operation of the device, controlling an external power input to charge an energy storage unit; and upon detecting an abnormality of the power supply, discharging the energy storage unit for providing power to the semiconductor storage device;

wherein:

controlling an external power input to charge an energy storage unit comprises adjusting a charge rate of the energy storage unit; and discharging the energy storage unit for providing power to the storage device comprises adjusting a discharge rate of the energy storage unit to ensure that the energy storage unit charges at a rate that is no less than the rate of discharge; and adjusting the charge rate of the energy storage unit includes intermittently storing energy in an inductor and discharging said energy to the energy storage unit; and adjusting the discharge rate of the energy storage unit includes intermittently storing energy in an inductor and discharging said energy to the storage device.

12. The method of claim 11, further comprising dynamically detecting a status of the energy storage unit and controlling the external power input to charge the energy storage unit according to the status to ensure sufficient backup electrical energy for the energy storage unit.

13. The method of claim 11, wherein the status of the energy storage unit is indicative of electrical energy stored in the energy storage unit and controlling an external power input to charge an energy storage unit according to the status to ensure sufficient backup electrical energy for the energy storage unit includes charging the energy storage unit when the electrical energy of the energy storage unit is insufficient and controlling the external power input to stop charging the energy storage unit after the energy storage unit is fully charged.

14. The method of claim 11, wherein further comprising dynamically detecting whether or not the power supply is abnormal.

15. The method of claim 11, further comprising selecting the external power input to supply power during normal operation of the device, and selecting the energy storage unit to supply power during an abnormal operation.

16. The method of claim 11, wherein the energy storage unit is a capacitor.

17. The method of claim 11, wherein the non-volatile semiconductor storage device is a flash memory.

* * * * *